United States Patent [19]
Patel

[11] Patent Number: 5,329,424
[45] Date of Patent: Jul. 12, 1994

[54] BUSBAR HOLDER FOR SECURING BUSBARS TO A PCB

[75] Inventor: Jayesh R. Patel, Garland, Tex.

[73] Assignee: AT&T Bell Laboratories, Murray Hill, N.J.

[21] Appl. No.: 115,951

[22] Filed: Sep. 1, 1993

[51] Int. Cl.⁵ .................................. H01R 9/00
[52] U.S. Cl. ........................... 361/775; 361/748; 361/760; 174/72 B; 439/64
[58] Field of Search .............. 361/728, 736, 748, 775, 361/760, 772, 749, 785; 174/72 B, 71 B, 70 B, 68.2; 439/64, 68, 55

[56] References Cited

U.S. PATENT DOCUMENTS

| | | | |
|---|---|---|---|
| 4,216,359 | 8/1980 | Hruda | 200/144 B |
| 4,536,826 | 8/1985 | Ahiskali | 361/407 |
| 5,067,043 | 11/1991 | Markowski | 361/361 |

Primary Examiner—Leo P. Picard
Assistant Examiner—Young Whang

[57] ABSTRACT

A busbar holder includes a supporting base having engaging prongs located at opposing ends of the supporting base. These engaging prongs engage receptacles in a printed circuit board (PCB) to secure the supporting base to the PCB. Four securing prongs extending vertically upward and having catch hooks at their free end are attached to the respective corners of the supporting base. A supporting wall extending vertically upward is attached to the supporting base and located intermediate the four securing prongs. Busbars are inserted between the wall and two of the securing prongs and are secured in place by the catch hooks.

9 Claims, 3 Drawing Sheets

BUSBAR HOLDER FOR SECURING BUSBARS TO A PCB

FIELD OF THE INVENTION

This invention relates to bus bars for conducting current and to an arrangement for busbar holders and securing the busbar and holder to PCB assemblies.

BACKGROUND OF THE INVENTION

A busbar assembly for attachment to printed circuit board (PCB) assemblies is disclosed in U.S. Pat. No. 4,536,826. In this arrangement two individual busbars are attached to opposing sides of a support member. This support member is affixed to a printed circuit board by connecting members of the support member that are engaged with receptacle cavities in the printed circuit board. The busbars are secured to the support member by pins. These pins engage apertures in the support member and are flattened into a head to secure the pin and busbar in place. This busbar assembly must be complete before the overall assembly is attached to the PCB. The assembly is rigid and allows no or little flexibility in the assembly process.

SUMMARY OF THE INVENTION

A busbar holder, constructed of a resilient dielectric material, includes a supporting base having engaging prongs located at opposing ends of the supporting base. These engaging prongs engage receptacles in a printed circuit board (PCB) to secure the supporting base to the PCB. Four securing prongs extending vertically upward and having catch hooks at their free end are attached to the respective corners of the supporting base. A supporting wall extending vertically upward is attached to the supporting base and located intermediate the four securing prongs. Busbars are inserted between the wall and two of the securing prongs and are secured in place by the catch hooks. Busbars located on opposing sides of the wall are insulated from one another by the dielectric material of the wall. This busbar holder may, if desired, be used to support a single busbar.

DETAILED DESCRIPTION

Figure 1:
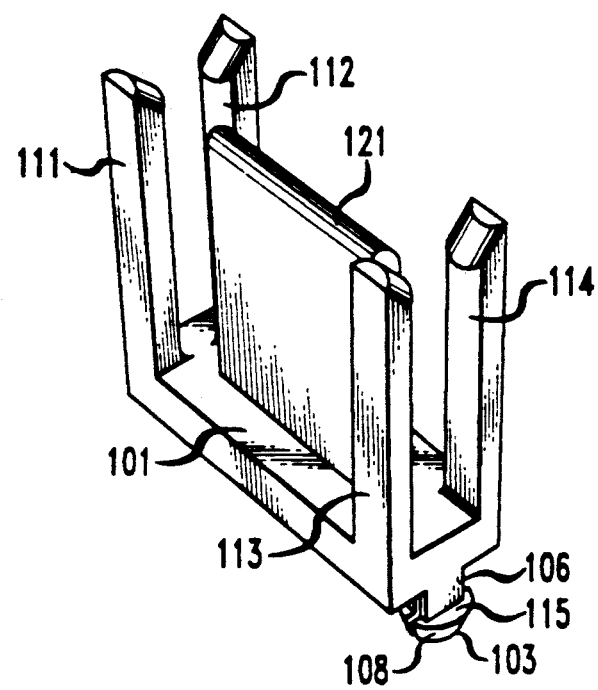
FIG. 1 is a pictorial view of the busbar holder with attached busbars and affixed to a PCB.
Figure 3:
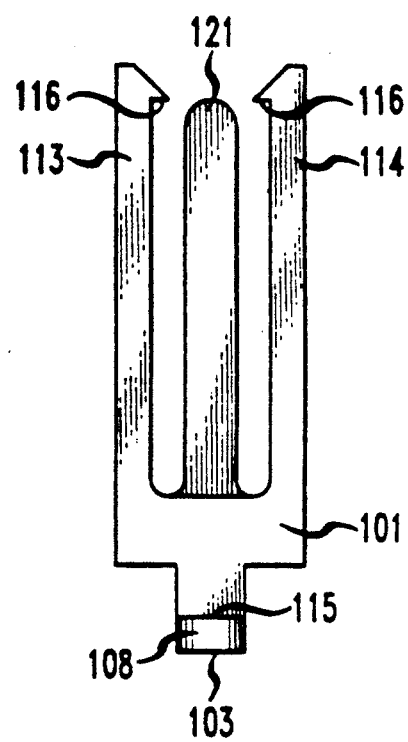
FIGS. 2, 3, 4 and 5 are orthographic projection views of the busbar holder of FIG. 1.
Figure 2:
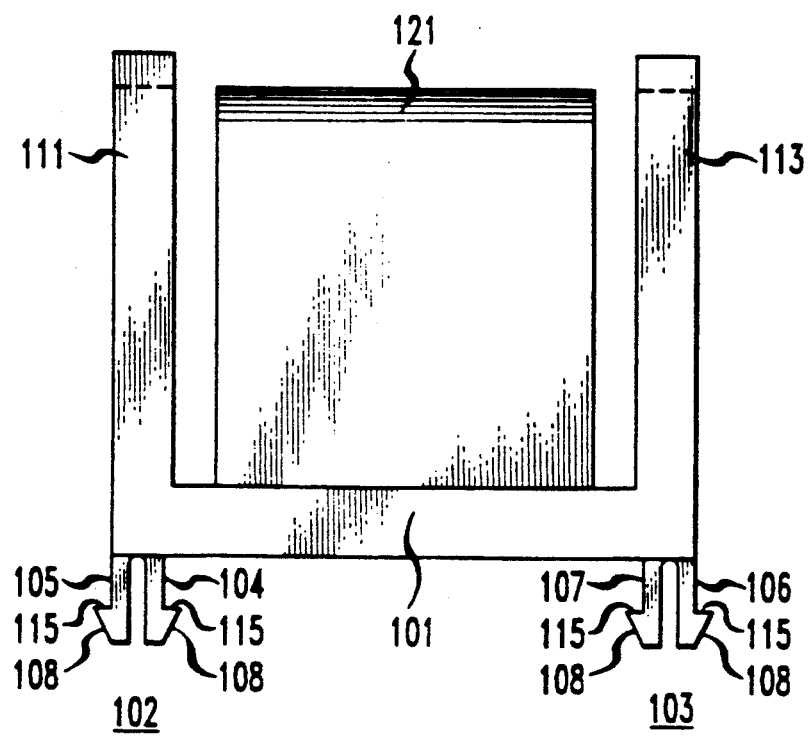
Figure 4:
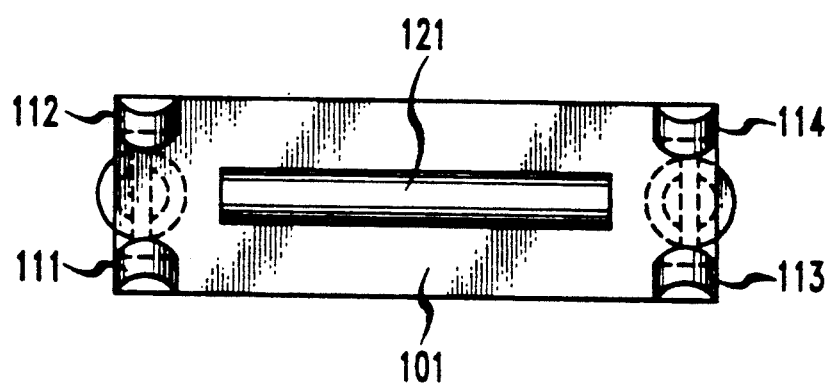
Figure 5:
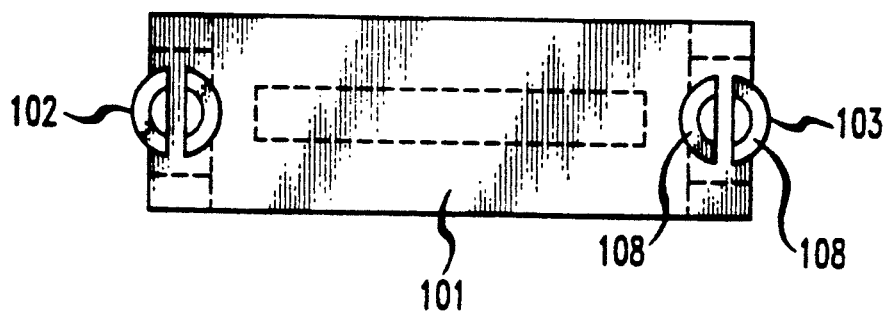
Figure 7:
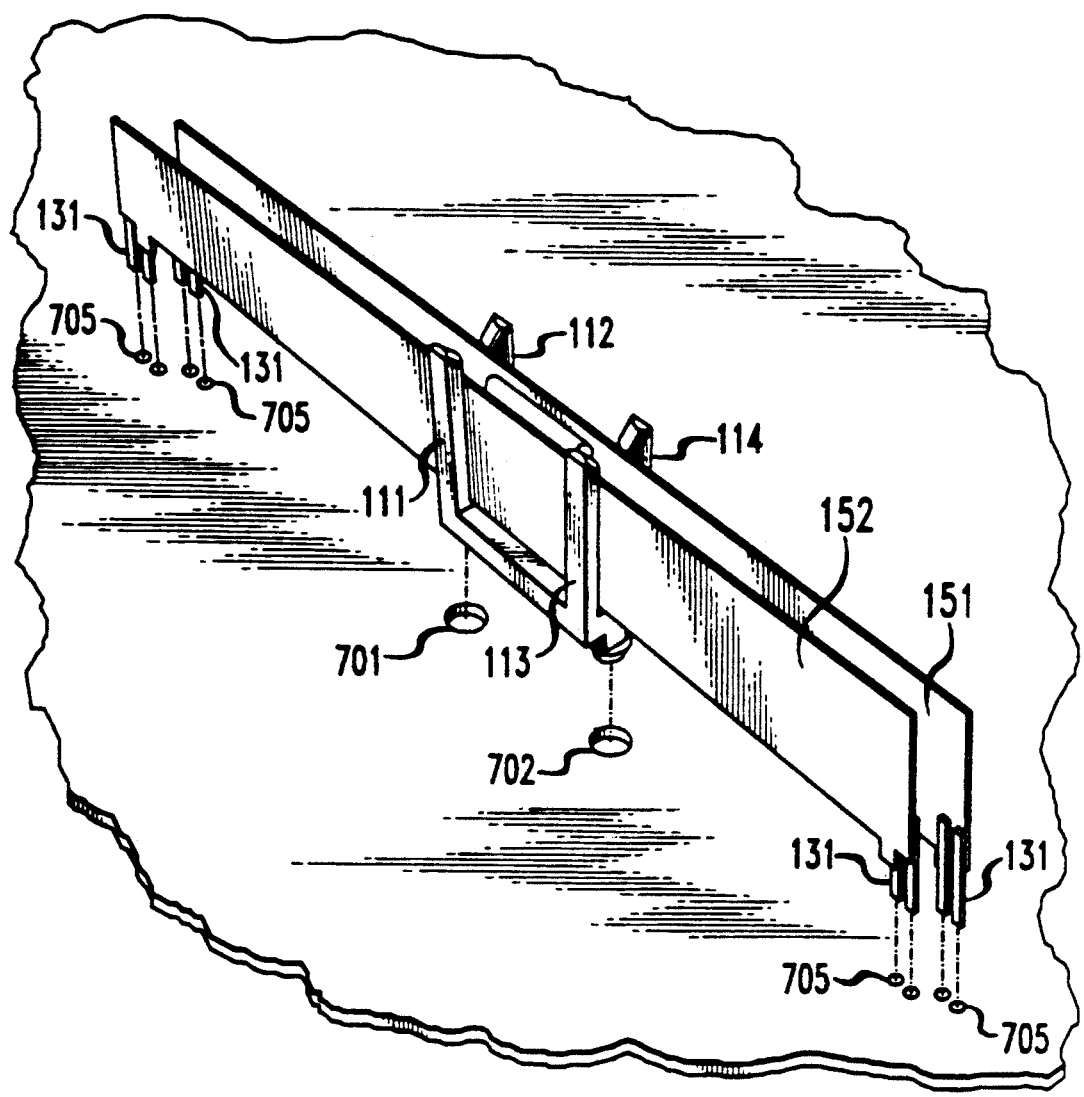
FIG. 7 is a pictorial view of the busbar holder with attached busbars as affixed to a PCB.

A busbar holder for attaching busbars to printed circuit boards (PCB) is shown in a pictorial view in FIG. 1 and in orthographic form in FIGS. 2, 3, 4 and 5. It includes a supporting base 101 with engaging prongs 102 and 103, for engaging apertures 701 and 702 in a PCB (see FIG. 7). These engaging prongs are molded integrally with the supporting base 101. These engaging prongs 102 and 103 are each bifurcated with two tines 104, 105, 106 and 107. Each tine has a catch surface or element 115 at its end used as a catch arrangement to secure the holder into the apertures 701 and 702 in the PCB. The two tines of an engaging prong each flex inwardly in response to a force provided during insertion into a receptacle aperture of the PCB as the inclined circular surface 108 at the end of each tine flexes inwardly and allows entry of the tines into the aperture. When the inclined circular surface has fully penetrated the aperture the two tines of the prong expand and the catch surface 109 engages the under side of the PCB securing the holder to the PCB.

The holder includes four securing prongs 111, 112, 113 and 114 attached to the supporting base 101 and extending vertically from the supporting base. Each securing prong has catch hooks 116 at its free end. A support wall 121 is connected to or molded with the supporting base 101 and extends vertically from the supporting base 101. It is located intermediate the first and second securing prongs 111 and 113 and the third and fourth securing prongs 112 and 114. The securing prongs are constructed of flexible dielectric plastic material and are preferably integrally molded with the base 101. The catch hooks are constructed with a dimensional distance from the end attached to the supporting base 101 to the underside of the catch hook 116 substantially equal to a width or height dimension of the busbar.

The busbar holder is preferably constructed and molded from as a unitary unit from a dielectric plastic having material properties that render its securing and engaging prongs resilient. These resilient properties fully allow its function as a securing and holding device. Specific materials are readily known to those skilled in the art. One suitable material for use in the illustrative embodiment is a plastic material such as a polyetherimide. Such material is marketed for instance by G. E. Plastics, LTD under the trademark ULTEM 1000 (TM).

Figure 6:
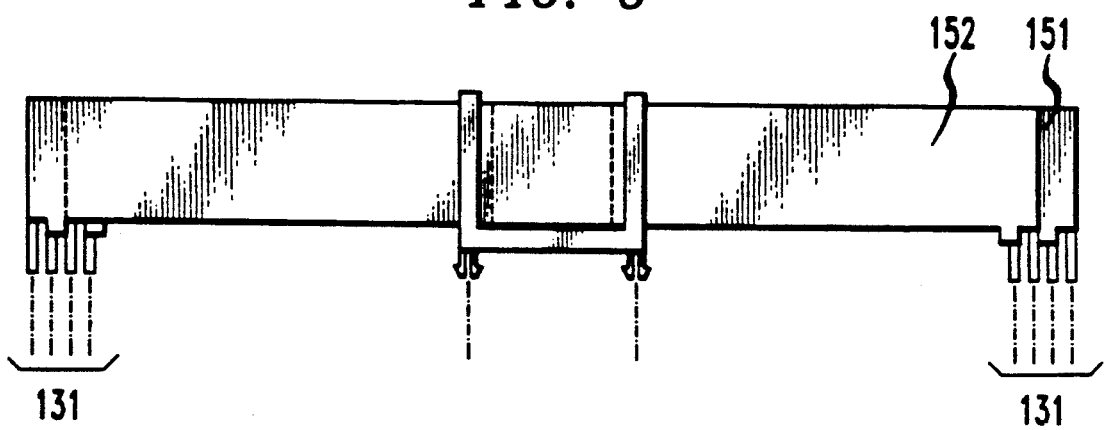
FIG. 6 is a side view of the busbar holder with attached busbars.

A typical application involves the insertion of two bus bars 151 and 152 into the holder. Such an arrangement is shown in the FIGS. 6 and 7. Each busbar is inserted between the support wall 121 and a pair of securing prongs 111 and 113 and 112 and 114. Each busbar includes conducting pins or extensions 131 to permit electrical connection of the busbar with an aperture 705 connected to a conductive path of the PCB. While an insertion into an aperture is shown to make electrical connection other connections may be made without departing from the spirit and scope of the invention.

The flexibility of the holder has enough dimensional slackness to permit the ready insertion of busbars into the PCB. This enhances ease of manufacturing and reduces a need for exacting dimensional tolerances. This arrangement permits busbar insertion into the holder before or after the holder is secured to the PCB. While a particular relative linear dimension between busbar and holder is illustrated, a busbar of differing lengths relative to the holder may be inserted into the and used with the holder. Various embodiments of the illustrative arrangement will suggest themselves to those skilled in the art without departing from the spirit and scope of the invention.

I claim:

1. A printed circuit board assembly comprising:
    a printed circuit board having receptacles suitable for accepting the engaging prongs of attachments to the board;
    a conducting busbar electrically connected to conducting paths of the printed circuit board;
    a busbar holder of an insulative and flexible material including:

a supporting base;

first and second engaging prongs attached to the supporting base and operative for engaging the receptacles and securing the busbar holder to the printed circuit board;

first, second, third, and fourth securing prongs attached to the supporting base and extending vertically from the supporting base and having catch hooks at their end opposite the end attached to the supporting base, the attachments to the base being at corners of the supporting base;

a support wall extending vertically from and attached to the supporting base and located intermediate the first and second securing prongs and the third and fourth securing prongs;

a busbar inserted between the support wall and the first and third securing prongs and held in place by their respective catch hooks.

2. The printed circuit board assembly as claimed in claim 1 comprising:

a second busbar inserted between the support wall and the second and fourth securing prongs and held in place by their respective catch hooks.

3. The printed circuit board assembly as claimed in claim 1 comprising:

the securing prongs each comprise a flexible time having a catch hook at its free end with a dimension distance from the end attached to the supporting base equal to a dimension of the busbar which it secures.

4. The printed circuit board assembly as claimed in claim 1 comprising:

the busbar including conducting pins for connection to conducting elements of the PCB.

5. The printed circuit board assembly as claimed in claim 1 comprising:

receiving holes in the PCB in register with the conducting pins and the first and second engaging prongs.

6. A busbar holder for securing busbars to a circuit support structure, the busbar holder being constructed of a substantially insulative and flexible material and including:

a supporting base;

first and second engaging prongs attached to the supporting base and operative for engaging receptacles included in a printed circuit board;

first, second, third, and fourth securing prongs attached to the supporting base and extending vertically from the supporting base and having catch hooks at their end opposite the end attached to the supporting base, the attachments to the base being at corners of the supporting base;

a support wall extending vertically from and attached to the supporting base and located intermediate the first and second securing prongs and the third and fourth securing prongs;

a pair of the first, second, third, and fourth securing prongs operative to secure at least a busbar inserted between the support wall and the pair of the securing prongs and held in place by their respective catch hooks.

7. The busbar holder for securing busbars to a circuit support structure, as claimed in claim 6;

a second busbar inserted between the support wall and a second pair of the first, second, third, and fourth securing prongs and held in place by their respective catch hooks.

8. The busbar holder for securing busbars to a circuit support structure, as claimed in claim 6;

the securing prongs each comprise a flexible tine having a catch hook at its free end with a dimension distance from the end attached to the supporting base equal to a dimension of the busbar which it secures.

9. The busbar holder for securing busbars to a circuit support structure, as claimed in claim 6;

the busbar including conducting pins for connection to conducting elements of the PCB.

* * * * *